(12) United States Patent
    Wang et al.

(10) Patent No.: US 10,902,760 B2
(45) Date of Patent: Jan. 26, 2021

(54) TEST CIRCUIT, DISPLAY SUBSTRATE, TEST METHOD THEREOF AND DISPLAY APPARATUS

(71) Applicants: BOE TECHNOLOGY GROUP CO., LTD., Beijing (CN); ORDOS YUANSHENG OPTOELECTRONICS CO., LTD., Ordos (CN)

(72) Inventors: Xiaowei Wang, Beijing (CN); Guoqing Zhang, Beijing (CN); Weifeng Wang, Beijing (CN); Hongwei Gao, Beijing (CN)

(73) Assignees: BOE TECHNOLOGY GROUP CO., LTD., Beijing (CN); ORDOS YUANSHENG OPTOELECTRONICS CO., LTD., Ordos (CN)

(*) Notice: Subject to any disclaimer, the term of this patent is extended or adjusted under 35 U.S.C. 154(b) by 72 days.

(21) Appl. No.: 16/222,045

(22) Filed: Dec. 17, 2018

(65) Prior Publication Data

US 2019/0236993 A1      Aug. 1, 2019

(30) Foreign Application Priority Data

Jan. 26, 2018   (CN) .......................... 2018 1 0079227

(51) Int. Cl.
    *G09G 3/00*    (2006.01)
    *H01L 51/56*   (2006.01)
    *H01L 27/32*   (2006.01)
    *G02F 1/13*    (2006.01)
    *H01L 51/00*   (2006.01)

(52) U.S. Cl.
    CPC ........... *G09G 3/006* (2013.01); *G02F 1/1309* (2013.01); *H01L 27/32* (2013.01); *H01L 51/0031* (2013.01); *H01L 51/56* (2013.01); *H01L 27/3276* (2013.01)

(58) Field of Classification Search
    CPC ..... G09G 3/006; H01L 27/3276; H01L 27/32; H01L 51/56; H01L 51/0031
    See application file for complete search history.

(56) References Cited

U.S. PATENT DOCUMENTS

| | | | |
|---|---|---|---|
| 2004/0145556 A1* | 7/2004 | Nakanishi ............ | G09G 3/3291 345/99 |
| 2009/0091345 A1* | 4/2009 | Cases ................ | G01R 31/31926 324/750.3 |

(Continued)

*Primary Examiner* — Dominic E Hawkins
(74) *Attorney, Agent, or Firm* — Nath, Goldberg & Meyer; Joshua B. Goldberg; Stephanie F. Majkut

(57) ABSTRACT

The present disclosure belongs to the field of display technology, and particularly relates to a test circuit, a display substrate, a test method of a display substrate and a display apparatus. The test circuit includes a signal generating device and a plurality of output channels that are mutually independent. Each output channel includes a signal line configured to transmit a test signal. The signal generating device is coupled to the plurality of output channels, and is configured to provide, to each of at least one of the plurality of output channels, the test signal corresponding to an impedance of the signal line in the output channel, and provide the test signal to the signal line in the output channel.

19 Claims, 4 Drawing Sheets

(56) References Cited

U.S. PATENT DOCUMENTS

| | | | | |
|---|---|---|---|---|
| 2010/0259527 A1* | 10/2010 | Odawara | ............... | G09G 3/3233 |
| | | | | 345/211 |
| 2013/0113688 A1* | 5/2013 | Choi | ................... | G09G 3/3266 |
| | | | | 345/76 |
| 2013/0134986 A1* | 5/2013 | Yun | ........................ | G09G 3/20 |
| | | | | 324/543 |
| 2015/0365182 A1* | 12/2015 | Morris | ............... | H04B 17/0085 |
| | | | | 455/423 |
| 2016/0041412 A1* | 2/2016 | Lv | ........................ | G02F 1/1309 |
| | | | | 324/760.02 |
| 2016/0284259 A1* | 9/2016 | Wu | ..................... | G01R 31/2894 |
| 2017/0309209 A1* | 10/2017 | Kenmotsu | ............ | G09G 3/3266 |

* cited by examiner

TEST CIRCUIT, DISPLAY SUBSTRATE, TEST METHOD THEREOF AND DISPLAY APPARATUS

CROSS-REFERENCE TO RELATED APPLICATION

This application claims the benefit of priority to Chinese Patent Application No. 201810079227.8 filed on Jan. 26, 2018, the contents of which are incorporated herein in their entirety by reference.

TECHNICAL FIELD

The present disclosure relates to the field of display technology, and particularly relates to a test circuit, a display substrate, a test method of a display substrate and a display apparatus.

BACKGROUND

In the production of OLED products, a series of tests, such as an aging test and an electrical test (ET for short), are required due to the production characteristics. The aging and electrical tests on a single product have great demand for equipment and manpower, which is not conducive to investment production. Therefore, OLED products are generally tested in groups.

SUMMARY

The present disclosure provides a test circuit, a display substrate, a test method of a display substrate, and a display apparatus, which can compensate for a test signal while maintaining a line width of a signal line, and also ensures utilization rate of the substrate and edge effect of the display substrate.

The present disclosure provides a test circuit including a signal generating device and a plurality of output channels that are mutually independent, wherein each output channel includes a signal line configured to transmit a test signal; and the signal generating device is coupled to the plurality of output channels, and is configured to provide, to each of at least one of the plurality of output channels, the test signal corresponding to an impedance of the signal line in the output channel, and provide the test signal to the signal line in the output channel.

Optionally, for each of the at least one of the plurality of output channels, the signal generating device is configured to compensate a basic signal corresponding to the output channel according to the impedance of the signal line in the output channel, to obtain the test signal corresponding to the output channel.

Optionally, for each of the at least one of the plurality of output channels, the signal generating device is configured to calculate the impedance of the signal line in the output channel based on a length and a cross-sectional area of the signal line, and obtain a compensation signal based on the calculated impedance, and compensate the basic signal corresponding to the output channel using the compensation signal, so as to obtain the test signal corresponding to the output channel.

Optionally, in the case of a same line width of the signal line, the longer the signal line, the larger a value of the compensation signal.

Optionally, for the test signal provided by the signal generating device to the signal line, the longer the signal line, the larger a value of the test signal corresponding to the signal line, in the case of a same line width of the signal line.

Optionally, the signal generating device includes a plurality of signal supply terminals, and multiple signal lines are coupled in parallel to one of the plurality of signal supply terminals.

Optionally, all of the signal lines have a same line width.

The present disclosure provides a display substrate including a test circuit according to the present disclosure and at least two independently-disposed sub-boards, each of the signal lines in the test circuit being coupled to only one test point of the sub-board and providing the test signal to the one test point.

Optionally, the signal generating device is configured to provide a basic signal required by the sub-board, and for each of at least one output channel coupled to the sub-board, the signal generating device is configured to compensate the basic signal based on an impedance of the signal line in the output channel, so as to obtain the test signal corresponding to the output channel.

Optionally, the signal generating device includes a plurality of signal supply terminals, and multiple signal lines are coupled in parallel to one of the plurality of signal supply terminals; and each sub-board is coupled to at least two signal lines, and the at least two signal lines are coupled to different signal supply terminals.

Optionally, the sub-board is one of a liquid crystal display panel and an organic light emitting diode display panel.

Optionally, the sub-board includes a conductive layer structure; and the signal line coupled to the sub-board and the conductive layer structure in the sub-board are disposed in a same layer.

Optionally, the signal line coupled to the sub-board and the conductive layer structure in the sub-board are formed by a same patterning process.

Optionally, the signal generating device in the test circuit is configured to compensate the basic signals of the plurality of output channels such that the test signals provided to the at least two sub-boards are the same, thereby performing a same test on the at least two sub-boards.

The present disclosure also provides a test method of a display substrate, the display substrate is a display substrate according to the present disclosure, and the test method includes steps of:

providing, to each of at least one of the plurality of output channels, a test signal corresponding to an impedance of a signal line in the output channel; and providing the test signal to one of test points of the at least two sub-boards through the output channel.

Optionally, the signal generating device obtains a compensation signal based on the impedance of the signal line, and in the case of a same line width of the signal line, the longer the signal line, the larger a value of the compensation signal.

Optionally, in the case of a same line width of the signal line, the longer the signal line, the larger a value of the test signal.

Optionally, the test method is applicable to an aging test and an electrical test, and a test signal of the aging test has a duration longer than a duration of a test signal of the electrical test.

Optionally, the test signal includes a signal supplied to a pixel electrode or an anode of the sub-board, a signal supplied to a common electrode or a cathode of the sub-board, and an AC power signal or a DC power signal supplied to other structure of the sub-board.

The present disclosure also provides a display apparatus including the sub-board in the display substrate according to the present disclosure.

DETAILED DESCRIPTION

To enable those skilled in the art to better understand the technical solutions of the present disclosure, a test circuit, a display substrate, a test method of a display substrate and a display apparatus of the present disclosure will be further described in detail below in conjunction with the accompanying drawings and the specific implementations.

The inventors have found that, in the production of small-sized OLED products, the number of products on a substrate (usually a glass substrate) is rather large (for example, 4032 panels may be provided on each substrate) due to the small size of the product. Aging and electrical tests using group of circuit design produce a signal line voltage drop. Due to different lines of OLED products, impedances of the lines are different, which inevitably produce different voltage drops. Due to the influence of the voltage drop of the signal line, reliability risk is brought to the aging process of the product, and luminance uniformity problem is brought to the electrical test process, resulting in fluctuation of the test accuracy.

Figure 1:
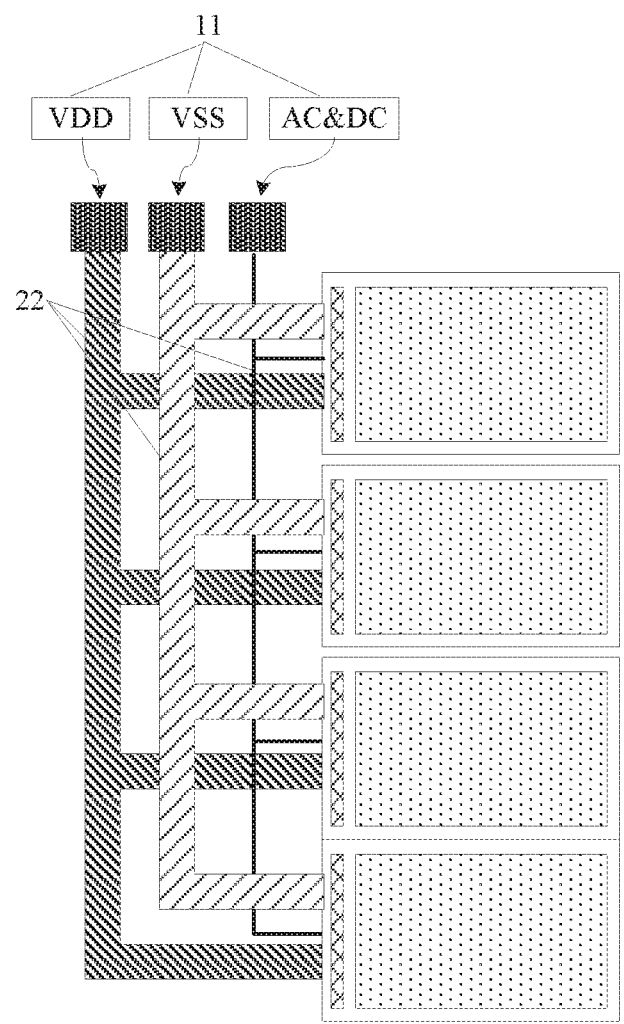
FIG. 1 is a schematic diagram showing a structural design of a conventional display substrate.

In the design of the aging and electrical tests of small-sized OLED products in groups, the voltage drop caused by the signal line can be compensated by increasing the line width, for example, the line width of the VDD & VSS signal lines can be increased to 10-20 mm. In addition, the test signal is coupled in series to the signal line of the OLED product, that is, only one output terminal is provided for each signal, and the OLED products to be tested in the group are coupled in series to each signal. As shown in FIG. 1, test boards in the group share one set of VDD&VSS signals. However, after the line width of the signal line is increased, the voltage difference of each OLED product to be tested cannot be compensated separately, and meanwhile, the utilization rate of the substrate is greatly reduced, thereby reducing the edge effect of the product.

In view of the above problems, embodiments of the present disclosure provide a display substrate that can compensate for a voltage drop of a line without increasing a line width and ensure utilization rate of the substrate.

Figure 2:
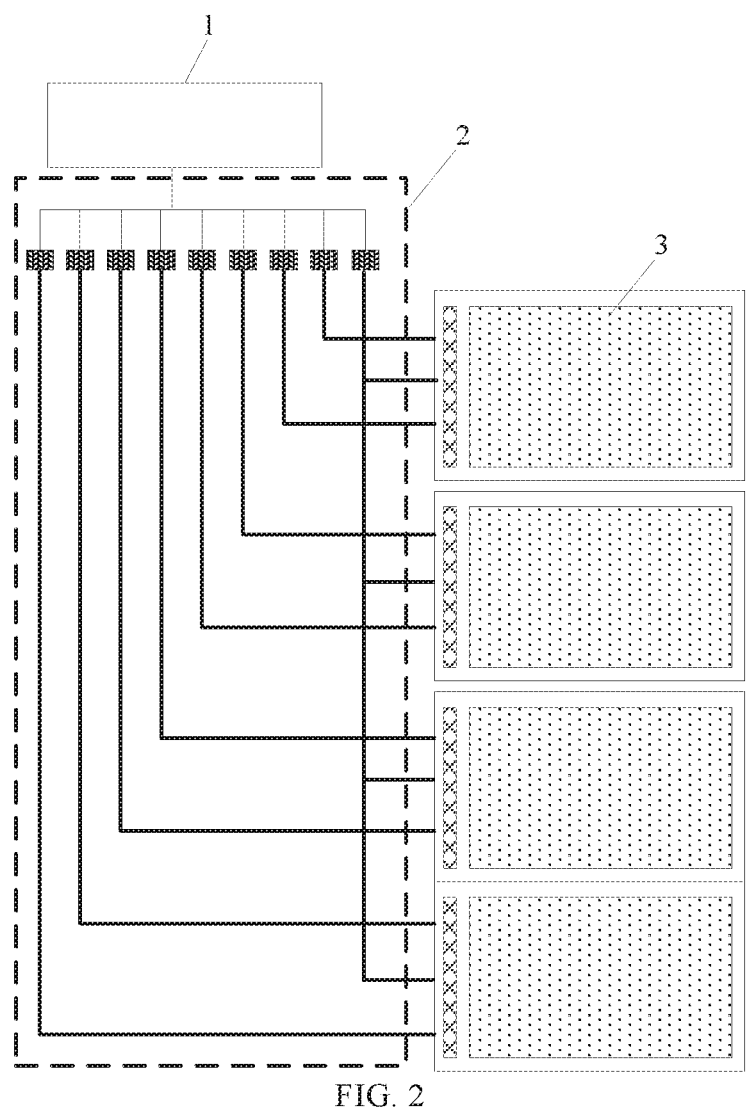
FIG. 2 is a schematic structural diagram of a display substrate according to an embodiment of the present disclosure.
Figure 3:
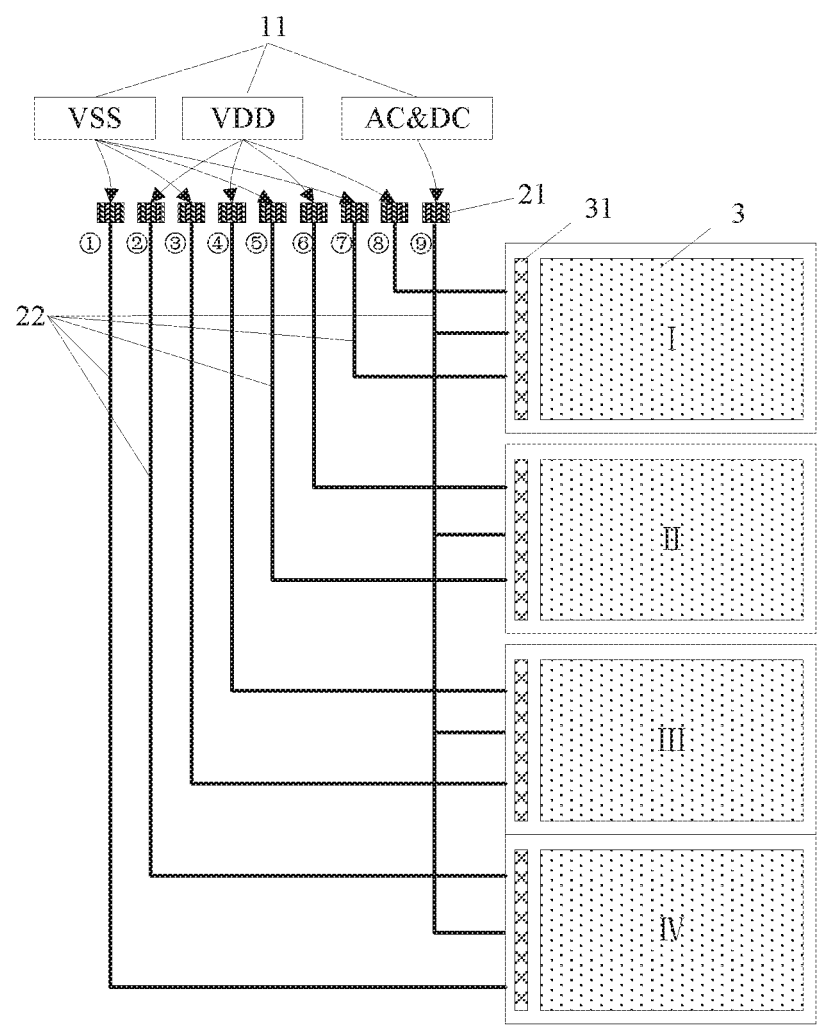
FIG. 3 is a schematic diagram showing a structural design of a display substrate according to an embodiment of the present disclosure.

As shown in FIGS. 2 and 3, the display substrate includes a test circuit and at least two independently-disposed sub-boards 3. In the embodiment, the case of four independent sub-boards 3 is taken as an example. The test circuit includes a signal generating device 1 and an output component 2.

The output component 2 includes a plurality of output channels that are mutually independent, each of the plurality of output channels includes a signal configuration pad 21 and a signal line 22 coupled to the signal configuration pad 21, each signal line 22 is coupled to only one test point 31 of a corresponding sub-board 3 and is configured to transmit a test signal to the corresponding sub-board 3.

The signal generating device 1 is coupled to the output component 2 and is configured to provide, to each of the plurality of output channels, a test signal corresponding to an impedance of the signal line 22 in the output channel, and provide the test signal to the signal configuration pad 21 in the output channel. In the embodiment of the present disclosure, the test circuit can perform a same test on each of the sub-boards 3.

The signal generating device 1 includes a basic signal providing device and a compensating device. The basic signal providing device is configured to provide a basic signal in accordance with the requirements of the sub-board 3. The compensating device is configured to compensate, based on the impedance of each signal line in the output component 2, the basic signal of the corresponding output channel so as to obtain the test signal for the corresponding output channel. By providing the signal configuration pads 21 and the signal lines 22 on a channel basis, the control of the output signal in the independent output channel can be achieved.

According to the embodiment of the present disclosure, the signal generating device 1 includes a plurality of signal supply terminals 11, and a plurality of signal configuration pads 21 may be coupled in parallel to one signal supply terminal 11; each of the sub-boards 3 is coupled to at least two signal lines 22, and the at least two signal lines 22 are coupled to the signal configuration pads 21 coupled to different signal supply terminals 11. Thus, each sub-board 3 can receive signals from at least two different signal supply terminals. Accordingly, the signal configuration pads 21 and the signal lines 22 are provided correspondingly to ensure independent control of the output signal in the independent output channel.

The compensating device calculates the impedance of the signal line 22 between the signal configuration pad 21 and the test point 31 of the sub-board 3 based on a length and a cross-sectional area of the signal line 22, obtains a compensation signal based on the calculated impedance, and compensates the basic signal of the corresponding output channel by using the compensation signal. For example, the compensating device can calculate a voltage compensation value for the corresponding output channel. It can be understood that, the compensation signals for the output channels in which the signal lines of different impedances are located may be different. Signal compensation in the independent output channel is realized based on the impedance of the signal line 22, and the signal lines 22 having different impedances are treated differently, so that each output channel outputs a same test signal, thereby ensuring the reliability of the aging process and the luminance uniformity of the electrical test process.

Optionally, in the case of a same line width of the signal line, the longer the signal line 22, the larger a value of the compensation signal.

As a signal provider, the signal generating device 1 synthesizes the compensation value for each output channel generated by the compensating device, and supplies a test signal to the signal configuration pad 21. In the case of a same line width of the signal line, the longer the signal line 22, the larger a value of the test signal. Therefore, signal supply of the independent output channel can be realized based on the impedance of the signal line 22.

In the above test circuit, the line widths of all the signal lines 22 that provide test signals for aging and electrical tests may be the same, and there is no need to increase the line width to solve the voltage drop problem.

The display substrate in this embodiment is a mother board, and aging and electrical tests are completed before cutting the mother board into the sub-boards 3. Optionally, the sub-board 3 is a liquid crystal display panel or an organic light emitting diode display panel. It can be easily understood that in order to realize on-off control of pixels, a plurality of control elements, such as thin film transistors, are inevitably included in the display substrate. The thin film transistor includes a plurality of conductive structure layers such as a gate electrode, a source electrode and a drain electrode, a semiconductor layer such as an active layer, and a plurality of insulating layers disposed between the conductive structure layers.

Optionally, the sub-board 3 includes a conductive layer structure; and the signal line 22 coupled to the sub-board 3 and the signal configuration pad 21 coupled to the signal line are disposed in the same layer and formed by the same patterning process as the conductive layer structure in the sub-board 3. Therefore, the preparation of the signal configuration pad 21 and the signal line 22 does not require an additional process.

Correspondingly, embodiments of the present disclosure further provide a test method based on the above display substrate, including steps of:

providing, to each of at least one of the plurality of output channels, a test signal corresponding to an impedance of a signal line 22 in the output channel; and providing the test signal to a test point 31 of a sub-board 3 through the output channel.

By using the above display substrate having a high utilization ratio and the signal line having a narrow line width, more accurate test results of aging and electrical tests for the respective sub-boards 3 can be ensured.

The compensation principle of the compensating device is as follows: signal compensation in the independent output channel is realized based on the impedance of the signal line 22, and in the case of a same line width of the signal line, the longer the signal line 22, the larger a value of the compensation signal.

Similarly, the signal supply principle of the signal generating device 1 is as follows: signal supply in the independent output channel is realized based on the impedance of the signal line 22, and in the case of a same line width of the signal line, the longer the signal line 22, the larger a value of the test signal.

The voltage and current corresponding to a test image are different from the voltage and current corresponding to an aging image. Since an OLED device is a current driving device, maintaining a same current driving value can ensure the luminance uniformity and aging process stability of the test image of each sub-board. Further, if resistance values of the signal lines of different sub-boards are constant, a driving current value under a fixed image brightness is generally a fixed value according to the structure of the OLED device. Therefore, a specific value of voltage drop or a specific value of voltage compensation in this embodiment may be calculated according to the following formula: U=IR, which is not detailed here.

Figure 4:
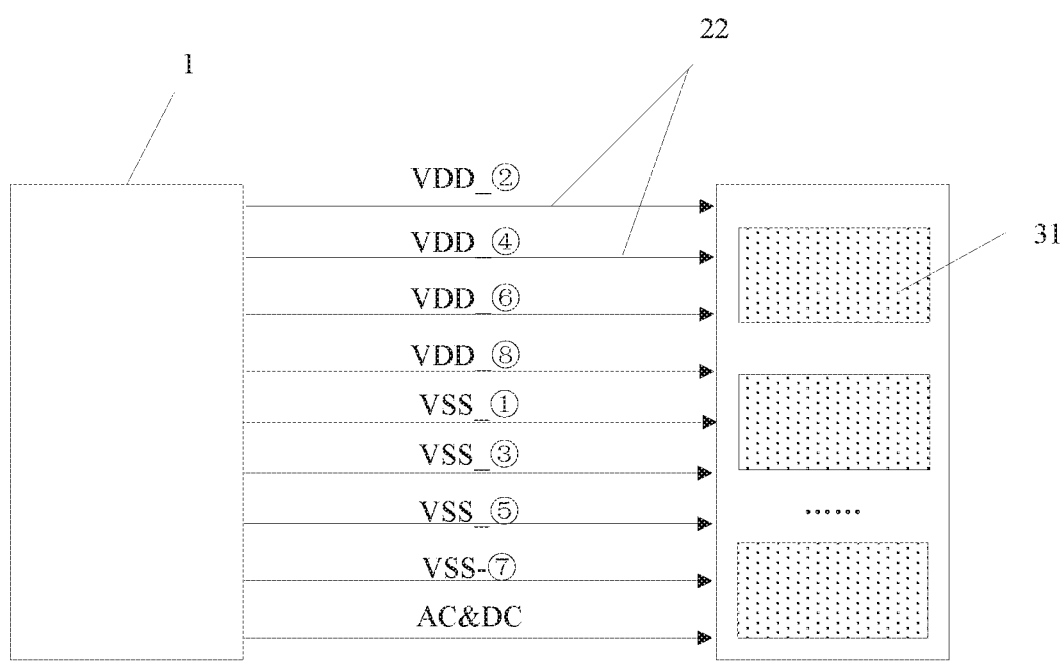
FIG. 4 is a schematic diagram showing signal control of a display substrate according to an embodiment of the present disclosure.

Referring to FIG. 3, in the signal control diagram of the display substrate shown in FIG. 4:

test signals ①&② provided by the signal generating device 1 correspond to VDD&VSS signals of sub-board_IV;

test signals ③&④ provided by the signal generating device 1 correspond to VDD&VSS signals of sub-board_III;

test signals ⑤&⑥ provided by the signal generating device 1 correspond to VDD&VSS signals of sub-board_II; and test signals ⑦&⑧ provided by the signal generating device 1 correspond to VDD&VSS signals of sub-board_I.

Correspondingly, absolute values of VDD voltages provided by the signal generating device 1 have the following relationship:

$$VDD\_②>VDD\_④>VDD\_⑥>VDD\_⑧.$$

Compensation values for the VDD voltages have the following relationship:

$$\text{compensation value\_②} > \text{compensation value\_④} > \text{compensation value\_⑥} > \text{compensation value\_⑧}.$$

In addition, absolute values of VSS voltages provided by the signal generating device 1 have the following relationship:

$$VSS\_①>VSS\_③>VSS\_⑤>VSS\_⑦.$$

Compensation values for the VSS voltages have the following relationship:

$$\text{compensation value\_①} > \text{compensation value\_③} > \text{compensation value\_⑤} > \text{compensation value\_⑦}.$$

In the test method of the display substrate of the present embodiment, the test includes an aging test and an electrical test, and a duration of the test signal of the aging test is longer than a duration of the test signal of the electrical test. Different test signals are provided for different tests, and signal compensation in the independent output channel is realized based on the impedance of the signal line 22.

In the present disclosure, the type of the signal supplied through the signal line 22 is not limited as long as it includes a necessary signal capable of realizing a basic test. Optionally, the test signal includes a signal VDD supplied to a pixel electrode or an anode of the sub-board 3, a signal VSS supplied to a common electrode or a cathode of the sub-board 3, and an alternating current power signal AC or a direct current power signal DC supplied to other structure of the sub-board 3.

It should be understood that, in the embodiment, the method in which the display substrate achieves signal compensation by means of independent signal lines is not only applicable to the compensation of the above signals VDD, VSS, AC or DC, but also to the compensation of a data signal DATA, etc., which is not detailed here.

In the display substrate and the corresponding test method according to the embodiments, by separately designing each signal line (e.g., VDD signal line or VSS signal line) of each panel (i.e., sub-board 3) in a group, VDD signal lines and VSS signal lines for aging and electrical tests are respectively disposed in parallel on a group basis, so that each sub-board in the group has its own set of VDD&VSS signals. By reducing the line width of the signal lines, during aging and electrical tests, the signal generating device separately controls the VDD&VSS signals of each sub-board, and compensates the VDD&VSS signals of each sub-board in the signal generating device according to voltage drop values (or the line width values and the line length values) of the signal lines, so that the value of each of VDD&VSS voltages reaching each sub-board is the same, and values of test voltages obtained by respective sub-boards in the group are consistent, thereby satisfying both the requirement of the aging process on the voltage value and the requirement of the electrical test process on the luminance stability. Further, the line width can be saved and the substrate utilization can be improved. The problem of low substrate utilization caused by increasing the line width to reduce voltage drop can be effectively solved.

Embodiments of the present disclosure provide a display apparatus including a sub-board obtained by cutting the display substrate in the above embodiments.

The display apparatus may be any product or component with a display function, such as a desktop computer, a tablet computer, a laptop, a mobile phone, a PDA, a GPS, an on-board display, a projection display, a camcorder, a digital camera, an electronic watch, a calculator, an electronic instrument, a meter, a liquid crystal panel, an electronic paper, a television, a display, a digital photo frame, a navigator or the like, which can be applied to various fields such as public display and unreal display.

It could be understood that the above embodiments are merely exemplary embodiments adopted for describing the principle of the present disclosure, but the present disclosure is not limited thereto. Various variations and improvements may be made by those of ordinary skill in the art without departing from the spirit and essence of the present disclosure, and these variations and improvements shall also be regarded as falling into the protection scope of the present disclosure.

The invention claimed is:

1. A test circuit, comprising:
a signal generating device and a plurality of output channels that are mutually independent,
wherein each output channel comprises a signal line configured to transmit a test signal;
the signal generating device is coupled to the plurality of output channels, and is configured to provide, to each of at least one of the plurality of output channels, the test signal corresponding to an impedance of the signal line in the output channel, and provide the test signal to the signal line in the output channel, and
for each of the at least one of the plurality of output channels, the signal generating device is configured to compensate a basic signal corresponding to the output channel according to the impedance of the impedance of the signal line in the output channel, to obtain the test signal corresponding to the output channel.

2. The test circuit of claim 1, wherein for each of at least one of the plurality of output channels, the signal generating device is configured to calculate the impedance of the signal line in the output channel based on a length and a cross-sectional area of the signal line in the output channel, and obtain a compensation signal based on the calculated impedance, and compensate the basic signal corresponding to the output channel using the compensation signal, so as to obtain the test signal corresponding to the output channel.

3. The test circuit of claim 2, wherein in the case of a same line width of the signal line, the longer the signal line, the larger a value of the compensation signal.

4. The test circuit of claim 1, wherein for the test signal provided by the signal generating device to the signal line, the longer the signal line, the larger a value of the test signal corresponding to the signal line, in the case of a same line width of the signal line.

5. The test circuit of claim 1, wherein the signal generating device comprises a plurality of signal supply terminals, and multiple signal lines are coupled in parallel to one of the plurality of signal supply terminals.

6. The test circuit of claim 1, wherein all of the signal lines have a same line width.

7. A display substrate, comprising the test circuit of claim 1 and at least two independently-disposed sub-boards, each of the signal lines in the test circuit being coupled to only one test point of a corresponding sub-board of the at least two independently-disposed sub-boards and providing the test signal to the one test point.

8. The display substrate of claim 7, wherein the signal generating device is configured to provide a basic signal required by the sub-board, and
for each of at least one output channel coupled to each sub-board, the signal generating device is configured to compensate the basic signal based on an impedance of the signal line in the output channel, so as to obtain the test signal corresponding to the output channel.

9. The display substrate of claim 7, wherein the signal generating device comprises a plurality of signal supply terminals, and multiple signal lines are coupled in parallel to one of the plurality of signal supply terminals; and
each sub-board is coupled to at least two signal lines, and the at least two signal lines are coupled to different signal supply terminals.

10. The display substrate of claim 7, wherein each sub-board is one of a liquid crystal display panel and an organic light emitting diode display panel.

11. The display substrate of claim 7, wherein each sub-board comprises a conductive layer structure; and
the signal line coupled to the sub-board and the conductive layer structure in the sub-board are disposed in a same layer.

12. The display substrate of claim 11, wherein the signal line coupled to a corresponding sub-board and the conductive layer structure in the corresponding sub-board are formed by a same patterning process.

13. The display substrate of claim 7, wherein the signal generating device in the test circuit is configured to compensate the basic signals of the plurality of output channels such that the test signals provided to the at least two sub-boards are the same, thereby performing a same test on the at least two sub-boards.

14. A display apparatus, comprising the sub-board in the display substrate of claim 7.

15. A test method of a display substrate, wherein the display substrate comprises a test circuit and at least two independently-disposed sub-boards, the test circuit comprises a signal generating device and a plurality of output channels that are mutually independent, each output channel comprises a signal line, the signal generating device is coupled to the plurality of output channels, each of the signal lines in the test circuit is coupled to only one test point of a corresponding sub-board of the at least two independently-disposed sub-boards, and the test method comprises steps of:
for each of at least one of the plurality of output channels, obtaining a test signal corresponding to the output channel by compensating a basic signal corresponding to the output channel according to an impedance of the signal line in the output channel,
providing, to each of the at least one of the plurality of output channels, the test signal corresponding to the impedance of the signal line in the output channel; and
providing the test signal to one of test points of the at least two sub-boards through the output channel.

16. The test method of claim 15, wherein the signal generating device obtains a compensation signal based on the impedance of the signal line, and in the case of a same line width of the signal line, the longer the signal line, the larger a value of the compensation signal.

17. The test method of claim 15, wherein in the case of a same line width of the signal line, the longer the signal line, the larger a value of the test signal.

18. The test method of claim 15, wherein the test method is applicable to an aging test and an electrical test, and a duration of a test signal of the aging test is longer than a duration of a test signal of the electrical test.

19. The test method of claim 15, wherein the test signal comprises a signal supplied to a pixel electrode or an anode of the sub-board, a signal supplied to a common electrode or a cathode of the sub-board, and an AC power signal or a DC power signal supplied to other structure of the sub-board.

* * * * *